United States Patent [19]

Dobberpuhl

[11] Patent Number: 5,160,855
[45] Date of Patent: Nov. 3, 1992

[54] FLOATING-WELL CMOS OUTPUT DRIVER

[75] Inventor: Daniel W. Dobberpuhl, Shrewsbury, Mass.

[73] Assignee: Digital Equipment Corporation, Maynard, Mass.

[21] Appl. No.: 850,248

[22] Filed: Mar. 11, 1992

Related U.S. Application Data

[63] Continuation of Ser. No. 723,205, Jun. 28, 1991, abandoned.

[51] Int. Cl.$^5$ .................... H03K 3/01; H03K 17/16
[52] U.S. Cl. .................................. 307/270; 307/443; 307/296.2; 307/296.5; 307/296.8; 307/475; 307/451
[58] Field of Search ................ 307/270, 296.2, 296.5, 307/296.8, 443, 451, 475

[56] References Cited

U.S. PATENT DOCUMENTS

| | | | |
|---|---|---|---|
| 4,675,557 | 6/1987 | Huntington | 307/475 |
| 4,678,950 | 7/1987 | Mitake | 307/550 |
| 4,709,162 | 11/1987 | Braceras et al. | 307/270 |
| 4,837,460 | 6/1989 | Uchida | 307/296.8 |
| 4,963,766 | 10/1990 | Lundberg | 307/451 |

FOREIGN PATENT DOCUMENTS 8906068  6/1989  PCT Int'l Appl. ............. 307/296.8

OTHER PUBLICATIONS

R. Dean Adams, et al. An 11ns 8K×18 CMOS Static RAM, pp. 242-243, Dated Feb. 19, 1988, 1988 IEEE International Solid-State Circuits Conference.

Hsing-San Lee, et al. An Experimental 1Mb CMOS SRAM with Configurable Organization and Operation, pp. 180-181, Dated Feb. 18, 1988, 1988 IEEE International Solid-State Circuits Conference.

Primary Examiner—Janice A. Howell
Assistant Examiner—Margaret Rose Wambach
Attorney, Agent, or Firm—Arnold, White & Durkee

[57] ABSTRACT

A CMOS bi-directional output driver normally operates at 3.3 volts but is capable of communicating with devices that operate at 5 volts.

11 Claims, 2 Drawing Sheets

FLOATING-WELL CMOS OUTPUT DRIVER

This application is a continuation of application Ser. No. 723,205, filed Jun. 28, 1991, now abandoned.

FIELD OF THE INVENTION

This invention relates generally to a method of constructing an integrated circuit that normally operates at a voltage below 5 volts but must, in certain circumstances interface with devices operating on a power supply voltage of 5 volts. This invention also relates generally to a floating well output driver that can operate with devices using a power supply voltage of 5 volts. More particularly, this invention relates to a CMOS bi-directional output stage which drives to 3.3 v when active, but can tolerate up to 5.0 v when disabled.

BACKGROUND OF THE INVENTION

As Complementary Metal Oxide Semiconductors (CMOS) have gotten progressively smaller, power supply voltages have been correspondingly reduced to reduce the deleterious effects of voltage differentials across increasingly smaller device dimensions. However, this reduction, from a nominal 5 volts to 3.3 volts has not occurred simultaneously with all manufacturers. Nor has this reduction occurred in all devices with which other semiconductor devices must communicate. Thus, a Very Large Scale Integrated (VLSI) chip designed to operate at 3.3 volts may need to interface with another chip operating at 5 volts.

To perform the interface properly requires special circuit or device techniques to avoid stress on components designed for 3.3 volts operation. The alternative is added cost for extra manufacturing steps necessary to make devices which can tolerate higher voltages at the input/output circuits for the integrated circuit.

FIG. 1 depicts a typical CMOS output driver. Such an output driver consists of two transistors, a pull-up transistor $Q_1$ and a pull-down transistor $Q_2$. Transistors $Q_1$ and $Q_2$ are driven by predriver circuits that receive data and enable signals. The predriver circuits are for the most part scaling stages to scale chip device widths (on the order of tens of microns) to off chip device widths (on the order of one thousand microns). The predriver circuits also include the logic to receive an enable signal which causes $V_p$ to go high which shuts off $Q_1$ and $V_n$ to go low which shuts off $Q_2$. As used herein, $V_p$ may be referred to as a positive logic input and $V_n$ may be referred to as a negative logic input.

Transistors $Q_1$ and $Q_2$ are large transistors that provide the currents that are associated with driving off-chip. When both $Q_1$ and $Q_2$ are disabled, the output $V_o$ is free to move between 0 (zero) volts and 3.3 volts, $V_p = 3.3$ V and $V_n = 0.0$ V. However, if the output driver is coupled to a circuit that operates with a logical 1 of five volts, $V_o$ may attempt to exceed 3.3 volts. This presents three problems (in no particular order). First, transistor $Q_1$ turns on since $|V_o - V_p| \geq |V_{tp}|$ (the threshold voltage of a PMOS device). Next, the parasitic diode between the drain of $Q_1$ and the well becomes forward biased. Finally, the voltages across $Q_2$ are both $V_o - V_n \geq 3.3$ V and $V_o - V_{ss} \geq 3.3$ V.

The last of these problems (regarding the voltages across $Q_2$) is commonly solved by adding a cascode transistor, $Q_3$, as shown in FIG. 2. By properly sizing $Q_3$ and $Q_2$, voltage $V_c$ can be controlled such that neither $Q_3$ nor $Q_2$ is exposed to excessive voltage. However, the addition of $Q_3$ does nothing to solve the first two problems.

Thus, there remains a need for a CMOS output driver stage that can operate normally with a power supply voltage of 3.3 volts and yet communicate with circuit devices that operate with a power supply voltage of 5 volts.

SUMMARY OF THE INVENTION

To solve the problem of $Q_1$ turning on when $V_o - V_p$ exceeds its threshold voltage, the present invention provides a VFG circuit, as shown in FIG. 4. If $V_o \leq$ (is less than or equal to) the biasing voltage $V_{dd}$, here nominally 3.3 volts, then the VFG voltage will be $V_p$. As used herein, $V_{dd}$ may also be referred to as a supply terminal. However, if $V_o$ is greater than $V_{dd}$, the VFG voltage will follow $V_o$ and be equal to $V_o$. In this way, the VFG circuit precludes $Q_1$ from turning on when $V_o$ is a logical 1 of greater than 3.3 volts.

Similarly, to solve the problem of forward biasing the parasitic diode of $Q_1$, the present invention provides a VFW circuit, as shown in FIG. 5. If $V_o$ is $\leq V_{dd}$, then the VFW voltage will be equal to $V_{dd}$. However, if $V_o$ is greater than $V_{dd}$, the VFW will follow $V_o$ and be equal to $V_o$. In this way, the VFW circuit precludes forward biasing the parasitic diode of $Q_1$ when $V_o$ is a logical 1 of greater than 3.3 volts.

These and other features of this invention will become more apparent by reference to the following description when taken in conjunction with the accompanying figures.

BRIEF DESCRIPTION OF THE DRAWING FIGURES

DETAILED DESCRIPTION OF A PREFERRED EMBODIMENT

Figure 1:
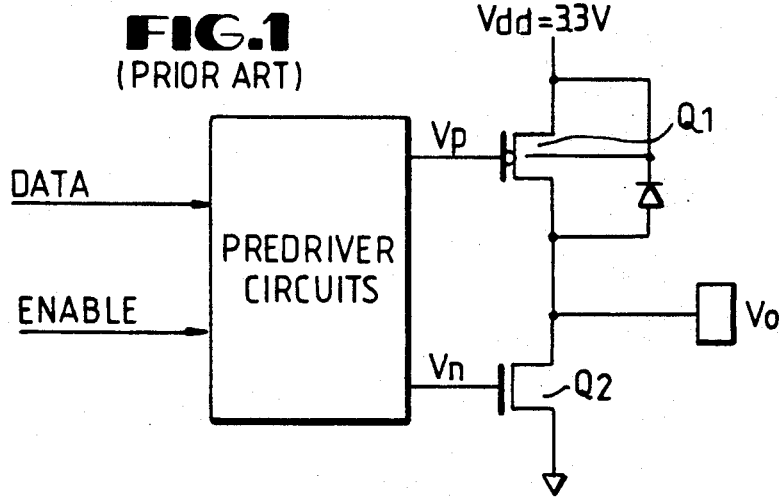
FIG. 1 depicts a prior art CMOS output driver stage.
Figure 2:
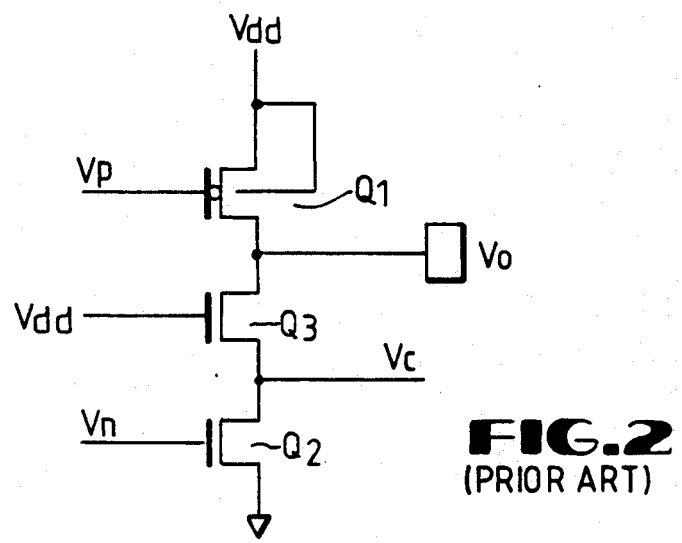
FIG. 2 depicts another prior art CMOS output driver stage.

FIG. 1 depicts a known CMOS output driver stage. The driver stage includes a set of lines including DATA and ENABLE lines. The DATA and ENABLE lines feed predriver circuits which develop a pair of voltages, $V_p$ and $V_n$, which range between 0.0 V and 3.3 V. The driver stage further includes a pull-up transistor $Q_1$ and a pull-down transistor $Q_2$. As shown, $Q_1$ may be a PMOS device while $Q_2$ may be an NMOS device. When both transistors are disabled, the output $V_o$ is free to move between 0 v and 3.3 v, $V_p$ is 3.3 v, and $V_n$ is 0.0 v.

Figure 3:
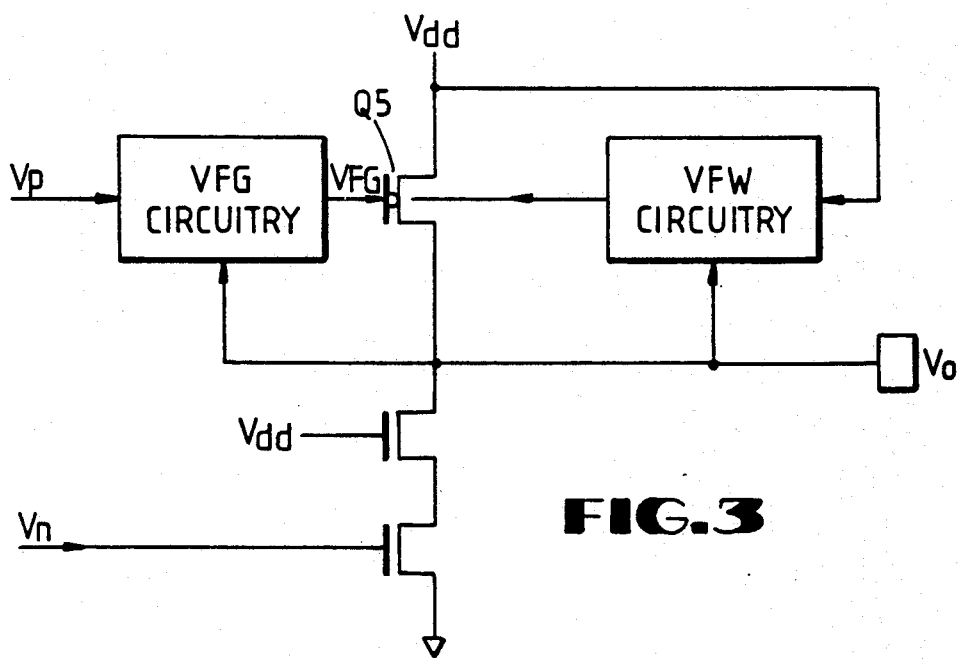
FIG. 3 depicts a bi-directional CMOS output driver stage of the present invention.

FIG. 3 depicts an output driver stage of the present invention. To avoid the undesirable turn-on of $Q_1$, the output driver stage includes a VFG circuitry, shown in FIG. 4. The term VFG refers to "floating gate". To avoid the undesirable forward biasing of the parasitic diode between the drain of $Q_1$ and the well in which it is formed, the output driver stage includes a VFW circuitry, shown in FIG. 5. The term VFW refers to "floating well".

Those of skill in the art will recognize that there is no physical difference between a source and a drain of a transistor and thus one may fairly refer to a source-to-drain path to describe the physical structure.

Figure 4:
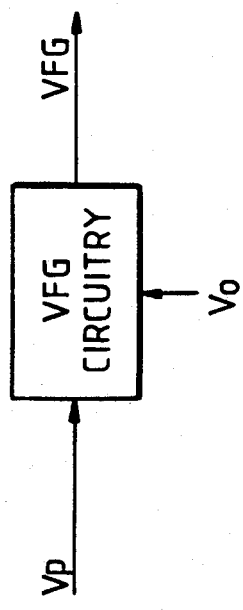
FIG. 4 depicts a sub-circuit of the bi-directional CMOS output driver stage of the present invention.
Figure 4:
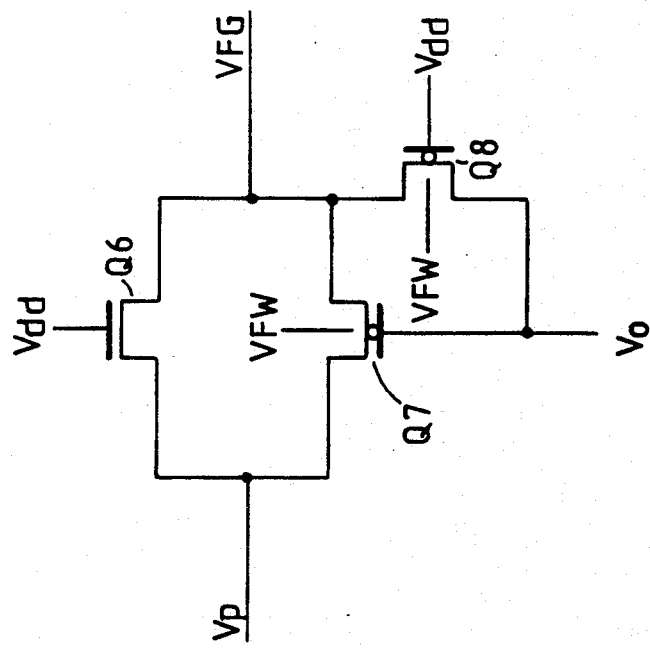

For the VFG circuitry shown in FIG. 4, if $V_o \geq V_{dd}$, then $Q_8$ is cut off and VFG $= V_p$. In this case, $V_p$ is applied to $Q_1$ and the output driver operates in the conventional manner. If $V_o > V_{dd}$, then $Q_8$ conducts and VFG will be equal to $V_o$. Similarly, for the VFW circuitry shown in FIG. 5, if $V_o \leq V_{dd}$, then VFW $= V_{dd}$; if $V_o > V_{dd}$, then VFW $= V_o$. The VFW signal is used in the VFG circuitry to supply the well voltage to $Q_7$ and $Q_8$.

When $V_p$ is low (0 v), the output driver stage should drive $V_o$ high (3.3 v). When $V_p$ is 0 v, $Q_6$ is conducting and the VFG signal is brought to 0 v. Under these circumstances, $V_o$ will be driven to 3.3 v and therefore $Q_7$ and $Q_8$ will be off.

When $V_p$ is high (3.3 v), the output may be driven to any voltage from 0 v to 5 v depending on conditions external to the output driver stage. There are three cases of primary interest:

$$V_o = 0 \text{ v} \quad (1)$$

In this case, PMOS device $Q_7$ is conducting and connects VFG to $V_p$ which is 3.3 v. NMOS device $Q_6$ is cut off since the voltage at each of its terminals is 3.3 v. PMOS device $Q_8$ is also cut off.

$$V_o = 3.3 \text{ v} \quad (2)$$

In this case, PMOS devices $Q_7$ and $Q_8$ are cutoff. NMOS device $Q_6$ will conduct until VFG $= V_p - V_t = 3.3 \text{ v} - V_t$. Thus, the output PMOS transistor $Q_1$ (see FIG. 3) controlled by VFG will be on slightly. However, $Q_1$ is also connected to $V_{dd} = 3.3$ V and thus no current will flow. If $V_o$ is slightly less than 3.3 v, then $Q_7$ turns on and pulls VFG up to $V_p = 3.3$ v. If $V_o$ is slightly greater than 3.3 v, then $Q_8$ turns on and pulls VFG up to $V_o$.

$$V_o = 5.0 \text{ v} \quad (3)$$

In this case, PMOS transistor $Q_8$ is on connecting VFG to $V_o = 5.0$ v. $Q_7$ and $Q_6$ are cutoff.

Figure 5:
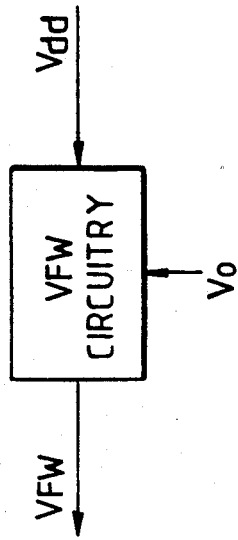
FIG. 5 depicts a further sub-circuit of the bi-directional CMOS output driver stage of the present invention.
Figure 5:
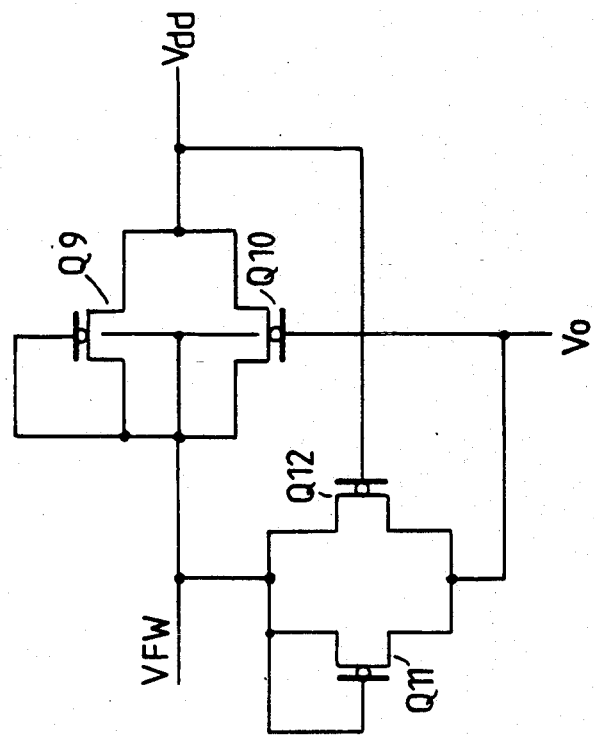

FIG. 5 depicts a preferred embodiment of the VFW circuit which is similar in some respects to the VFG circuit. Distinctions between the VFG circuit of FIG. 4 and the VFW circuit of FIG. 5 are associated primarily with PMOS transistors $Q_9$ and $Q_{11}$. PMOS transistors $Q_{12}$ and $Q_{10}$ correspond directly with $Q_8$ and $Q_7$, respectively, of the VFG circuitry of FIG. 4.

All MOS devices have associated parasitic diodes between their source/drains and the underlying substrate or well. The purpose of the VFW structure is to avoid turning these diodes on since these diode currents can trigger latch-up or, at a minimum, cause large parasitic currents to flow.

Consider the case of $V_o = V_{dd} = 3.3$ V. In this case, $Q_9$ and $Q_{11}$ will pull VFW up to $V_o - V_t$ which is approximately the same as the forward bias turn-on of the parasitic drain diodes. $Q_{10}$ and $Q_{12}$ will be off. If $V_o$ is now ramped up to 5.0 v, there is a danger of the diodes associated with $Q_{11}$ and $Q_{12}$ turning on hard. It is the purpose of $Q_{11}$ and $Q_{12}$ to provide to necessary current to charge VFW in parallel with $V_o$. $Q_{11}$ is initially most effective because of the slight gate bias provided by VFW (i.e., approximately $-0.6$ V). In addition to MOS-FET action, $Q_{11}$ will function as an enhanced $\beta$, low $V_{be}$ lateral PNP device. Once $V_o$ is substantially higher than $V_{dd}$ (i.e., about 3.9 V), then $Q_{12}$ will become more effective at supplying current to VFW. $Q_9$ and $Q_{10}$ function analogously to $Q_{11}$ and $Q_{12}$ during initial chip power up when the $V_{dd}$ supply itself is ramping to 3.3 V.

While the present invention has been described in connection with a preferred embodiment, those of ordinary skill in the art will recognize many modifications to the present invention and this application is intended to cover any adaptations or variations of the invention.

I claim:

1. A floating well CMOS output driver comprising:
    a. a pull-up transistor having a source-to-drain path and a gate, the source-to-drain path connected at a first end to a supply terminal and connected at a second end to an output terminal;
    b. a pull-down transistor having a source-to-drain path and a gate, the source-to-drain path of the pull-down transistor connected at a first end to ground, the gate of the pull-down transistor connected to a negative logic input;
    c. a cascode transistor having a source-to-drain path and a gate, the source-to-drain path connected in series between the second end of the pull-up transistor and the second end of the pull-down transistor, the gate of the cascode transistor connected to the supply terminal;
    d. a floating well circuit comprising
        i. first and second transistors each having a source-to-drain path and a gate, the source-to-drain paths of the first and second transistors being each connected at a first end to the supply terminal, a second end of the source-to-drain paths of the first and second transistors, the gate of the first transistor, and the wells of the first and second transistors each being connected to a floating well circuit output node coupled to the well of the pull-up transistor; and
        ii. third and fourth transistors each having a source-to-drain path and a gate, a first end of the source-to-drain path of each of the third and fourth transistors connected to the output terminal, a second end of the source-to-drain path of each of the third and fourth transistors and the gate of the fourth transistor each connected to the floating well circuit output node, the gate of the third transistor connected to the supply terminal; and
    e. a floating gate circuit comprising
        i. fifth and sixth transistors each having a source-to-drain path and a gate, the source-to-drain paths of the fifth and sixth transistors each connected at one end to a positive logic input, the other end of the source-to-drain paths of the fifth and sixth transistors connected to a floating gate circuit output node which is connected to the gate of the pull-up transistor, the gate of the fifth transistor connected to the supply terminal, the gate of the sixth transistor connected to the output terminal, and the well of the sixth transistor connected to the floating well circuit output node; and
        ii. an seventh transistor having a source-to-drain path and a gate, a first end of the source-to-drain path of the seventh transistor connected to the output terminal, a second end of the source-todrain path of the seventh transistor connected to the floating gate circuit output node, the gate of the seventh transistor connected to the supply terminal, and the well of the sixth transistor connected to the floating well circuit output node.

2. The output driver of claim 1 wherein the pull-down transistor, the cascode transistor, and the fifth transistors are N-channel and the other transistors are P-channel.

3. An output driver circuit comprising:
a pull-up transistor having a gate and a well, and having a source-to-drain path connecting a first supply terminal to an output node, said gate being connected to a first push-pull drive voltage through a gate circuit, said well being connected to said first supply terminal by a well circuit;
a pull-down transistor having a gate and having a source-to-drain path connecting a second supply terminal to an internal node, said gate being connected to a second push-pull drive voltage;
a cascode transistor having a gate and having a source-to-drain path connecting said output node to said internal node; said gate being connected to said first supply terminal;
said gate circuit having an input connected to receive the voltage on said output node and effective to allow the voltage on said gate of said pull-up transistor to follow the voltage on said output node if the voltage on said output node exceeds the voltage on said first supply terminal;
said well circuit having an input connected to receive the voltage on said output node and effective to allow the voltage on said well of said pull-up transistor to follow the voltage on said output node if the voltage on said output node exceeds the voltage on said first supply terminal.

4. A circuit according to claim 3 wherein said pull-up transistor is a P-channel MOS transistor and said pull-down transistor is an N-channel MOS transistor.

5. A circuit according to claim 4 wherein the voltage on said first supply terminal is a positive value of about 3.3 volts and the voltage on said a second supply terminal is a reference potential.

6. A circuit according to claim 4 wherein said gate circuit includes:
a first transistor having a source-to-drain path connecting said first push-pull drive voltage to said gate of said pull-up transistor and having a gate connected to said first supply terminal;
a second transistor having a source-to-drain path connecting said first push-pull drive voltage to said gate of said pull-up transistor and having a gate connected to said output node;
a third transistor having a source-to-drain path connecting said output node to said gate of said pull-up transistor and having a gate connected to said first supply terminal;
each of said second and third transistors having a well connected to said well of said pull-up transistor.

7. A circuit according to claim 6 wherein said second and third transistors are P-channel MOS transistors and said first transistor is an N-channel MOS transistor.

8. A circuit according to claim 4 wherein said well circuit includes:
a fourth transistor having a source-to-drain path connecting said well of said pull-up transistor to said first supply terminal and having a gate connected to said well of said pull-up transistor;
a fifth transistor having a source-to-drain path connecting said well of said pull-up transistor to said first supply terminal and having a gate connected to said output node;
a sixth transistor having a source-to-drain path connecting said output node to said well of said pull-up transistor and having a gate connected to said first supply terminal;
a seventh transistor having a source-to-drain path connecting said output node to said well of said pull-up transistor and having a gate connected to said well of said pull-up transistor.

9. A circuit according to claim 8 wherein said fourth, fifth, sixth and seventh transistors are P-channel MOS transistors.

10. A circuit according to claim 8 wherein said gate circuit includes:
a first transistor having a source-to-drain path connecting said first push-pull drive voltage to said gate of said pull-up transistor and having a gate connected to said first supply terminal;
a second transistor having a source-to-drain path connecting said first push-pull drive voltage to said gate of said pull-up transistor and having a gate connected to said output node;
a third transistor having a source-to-drain path connecting said output node to said gate of said pull-up transistor and having a gate connected to said first supply terminal;
each of said second and third transistors having a well connected to said well of said pull-up transistor.

11. A circuit according to claim 10 wherein said first transistor is an N-channel MOS transistor, and said second, third, fourth, fifth, sixth and seventh transistors are P-channel MOS transistors.

* * * * *

UNITED STATES PATENT AND TRADEMARK OFFICE
CERTIFICATE OF CORRECTION

PATENT NO. : 5,160,855

DATED : November 3, 1992

INVENTOR(S) : Daniel W. Dobberpuhl

It is certified that error appears in the above-identified patent and that said Letters Patent is hereby corrected as shown below:

Column 3, line 5, " $\geqq$ " should be -- $\leq$ --.

Signed and Sealed this

Fifth Day of October, 1993

Attest:

BRUCE LEHMAN

Attesting Officer

Commissioner of Patents and Trademarks